United States Patent [19]
Sakamoto

[11] Patent Number: 5,841,181
[45] Date of Patent: Nov. 24, 1998

[54] SEMICONDUCTOR APPARATUS HAVING FIELD LIMITING RINGS

[75] Inventor: Kazuhisa Sakamoto, Kyoto, Japan

[73] Assignee: Rohm Co., Ltd., Kyoto, Japan

[21] Appl. No.: 716,412

[22] PCT Filed: Feb. 19, 1996

[86] PCT No.: PCT/JP96/00367

§ 371 Date: Sep. 20, 1996

§ 102(e) Date: Sep. 20, 1996

[87] PCT Pub. No.: WO96/26547

PCT Pub. Date: Aug. 29, 1996

[30] Foreign Application Priority Data

Feb. 20, 1995 [JP] Japan .................................... 7-031147

[51] Int. Cl.$^6$ .......................... H01L 23/58; H01L 27/082
[52] U.S. Cl. .......................... 257/487; 257/491; 257/495; 257/593
[58] Field of Search ..................................... 257/487, 491, 257/494, 495

[56] References Cited

U.S. PATENT DOCUMENTS

B 520,115  3/1976  Matsushita et al. .................... 257/495
4,158,206  6/1979  Neilson .................................. 257/495

FOREIGN PATENT DOCUMENTS 52-4787  1/1977  Japan .................................... 257/495
524787   1/1977  Japan .................................... 257/495

*Primary Examiner*—Wael Fahmy
*Attorney, Agent, or Firm*—Baker & Botts, LLP

[57] ABSTRACT

It is an object to provide a semiconductor apparatus having improved dielectric breakdown strength characteristics both by eliminating the discontinuity caused to the interface between a semiconductor layer and the overlying insulator film on account of the FLR provided for increasing the dielectric breakdown strength and by preventing the redistribution of impurities from the FLR into the insulator film. Another object is to provide a process for fabricating such improved semiconductor apparatus. The semiconductor layers of a first conduction type (i.e., n$^-$ type semiconductor layer 1b and epitaxial layer 1c) are provided with the semiconductor region of a second conduction type (i.e., p-type base region 2) to form a semiconductor device (transistor) and FLRs 4a and 4b are provided external to the perimeter of said semiconductor region but without being exposed from the surface of the epitaxial layer 1c.

3 Claims, 3 Drawing Sheets

SEMICONDUCTOR APPARATUS HAVING FIELD LIMITING RINGS

TECHNICAL FIELD

The present invention relates to semiconductor apparatus such as diodes, transistors, thyristors, insulated-gate bipolar transistors (IGBTs), MOSFETs and ICs, particularly those which are improved in the breakdown voltage.

BACKGROUND ART

A conventional method for increasing the dielectric breakdown strength of semiconductor apparatus such as a transistor is shown schematically in FIG. 4. A base region indicated by 2 has a field-limiting ring (FLR) 4 provided external to its perimeter such that a depletion layer 11 formed below the pn junction 10 between the base region 2 and a collector region 1 is extended beyond the perimeter of the FLR 4.

The conventional transistor comprises the collector region 1 which comprises an $n^+$ type semiconductor substrate 1a and an $n^-$ type semiconductor layer 1b of low impurity level that is formed on the substrate 1a by epitaxial growth, the p-type base region 2 which is formed in the collector region 1 by a suitable technique such as diffusion, and an emitter region 3 which is formed from an $n^+$ type impurity in the base region 2 by a suitable technique such as diffusion. The FLR 4 which is of the same conduction type (p-type) as the base region 2 is provided external to the perimeter of the pn junction 10 between the base and collector regions. The transistor also has an insulator film typically formed of $SiO_2$ and which is provided on the surface of the semiconductor layer 1b, a device defining annular member 6, a collector electrode 7, a base electrode 8, and an emitter electrode 9.

The transistor of the planar type described in the above is incapable of exhibiting the theoretical dielectric breakdown strength because charges and other impurities will be generated either within the oxide or otherwise formed insulator film 5 or at the interface between the semiconductor layer 1b and the insulator film 5. To deal with this problem and secure a higher breakdown voltage, the transistor uses a wafer having a higher specific resistance than the theoretical or FLR 4 is provided as shown in FIG. 4 such that the depletion layer 11 below the pn junction 10 between the base and collector regions is allowed to extend beyond the perimeter of the FLR 4. Having the same conduction type as the base region 2, FLR 4 is usually formed in the same step as the base region 2 and in a similar manner.

As shown in FIG. 5, the formation of the base region 2 by thermal diffusion is conducted simultaneously with the provision of a mask pattern for the making of the emitter region by forming an oxide film 51 on the surface of the semiconductor layer 1b, as well as oxide films 52 and 54 on the base region 2 and FLR 4, respectively, by a suitable oxidation technique such as thermal oxidation. During the oxidation, oxide films 52 and 54 grow rapidly since the base region 2 and FLR 4 have higher impurity levels than the $n^-$ type semiconductor layer 1b. On the other hand, the growth of oxide film 51 is slow because the $n^-$ type semiconductor layer 1b not only has a lower impurity level but also is overlaid with the oxide film 5. As the oxide films 51, 52 and 54 grow, the interface 62 between the semiconductor layer 1b and the oxide film 5 will move into the interior of the semiconductor layer 1b; however, due to the growth rate difference mentioned above, the interface 62 is shallow in the oxide film 51 and deep in the base region 2 and FLR 4. As a result, the interface 62 provides a discontinuous profile along the surface of the semiconductor layer 1b. At the same time, the n-type impurity in the semiconductor layer 1b and the oxide film 5, as well as the p-type impurity in the base region 2, FLR 4 and oxide films 52 and 54 will be redistributed through the interface 62 until the chemical potential is equilibrated on both sides of the interface. Because of this generally known effect, the impurities will be redistributed in the respective oxide films. The phenomena just described above occur again during the formation of the emitter region.

If the interface between the insulator film 5 and the semiconductor layer 1b provides a discontinuous profile, unwanted field concentration will occur. If the impurities in the base region 2 and the FLR 4 migrate to be redistributed into the insulator film 5, positive charges and other minority carriers will be introduced into the insulator film 5, thereby inducing negative charges on the surface of the semiconductor layer 1b. In either case, the dielectric breakdown strength characteristics of the device will deteriorate.

DISCLOSURE OF INVENTION

The present invention has been accomplished under these circumstances and has as an object providing a semiconductor apparatus having improved dielectric breakdown strength characteristics. This object is attained both by eliminating the discontinuity caused to the interface between the semiconductor layer and the overlying insulator film on account of the FLR provided for increasing the dielectric breakdown strength and by preventing the redistribution of impurities from the FLR into the insulator film.

Another object of the invention is to provide a process for fabricating such improved semiconductor apparatus.

The semiconductor apparatus according to the first aspect of the invention comprises a semiconductor layer of a first conduction type, a semiconductor region of a second conduction type provided in said semiconductor layer to form a semiconductor device, and a field-limiting ring of a second conduction type provided external to the perimeter of said semiconductor region to improve the breakdown voltage, said field-limiting ring being provided in such a way that it is not exposed from the surface of said semiconductor layer.

In a preferred embodiment, said semiconductor region of a second conduction type to form a semiconductor device is the base region of a transistor and said field-limiting ring is provided outside the perimeter of said base region. The transistor of this configuration has a high breakdown voltage.

The process according to the second aspect of the invention is for fabricating a semiconductor apparatus comprising a semiconductor layer of a first conduction type, a semiconductor region of a second conduction type provided in said semiconductor layer to form a semiconductor device, and a field-limiting ring of a second conduction type provided external to the perimeter of said semiconductor region to improve the breakdown voltage and it comprises the steps of forming said field-limiting ring in said semiconductor layer of a first conduction type, forming an epitaxial layer of a first conduction type on the surface of said semiconductor layer of a first conduction type, and forming said semiconductor region of a second conduction type from the surface of said epitaxial layer.

In the semiconductor apparatus according to the first aspect of the invention, the FLR provided external to the perimeter of the semiconductor region of a second conduction type which is provided in the semiconductor layer of a first conduction type to form a device is buried such that it will be not exposed from the surface of the semiconductor layer. Even if an insulator film is formed on the surface of the semiconductor layer by a suitable oxidation technique such as thermal oxidation, there is no possibility for the occurrence of FLR-induced discontinuity in the interface between the insulator film and the semiconductor layer or the redistribution of impurities from the FLR into the insulator film. As a result, the FLR ensures that the depletion layer below the pn junction between the collector and base regions will extend beyond the perimeter of the FLR and yet there will be no FLR-induced drop in the breakdown voltage, thereby providing a semiconductor apparatus having higher dielectric breakdown strength.

In the process according to the second aspect of the invention, a FLR is formed from the surface of the semiconductor layer and, thereafter, an epitaxial layer of the same conduction type and having the same impurity level as said semiconductor layer is grown on the entire surface of that semiconductor layer. As a result, the FLR is completely enclosed by the two similar semiconductor layers and a semiconductor region of a second conduction type can be formed from the surface of that epitaxial layer, thereby enabling the fabrication of the intended semiconductor apparatus in which the FLR is not exposed from the surface of the epitaxial layer.

As described in the above, the semiconductor apparatus according to the first aspect of the invention comprises a semiconductor layer of a first conduction type that is provided with a semiconductor region of a second conduction type to form a semiconductor device and said semiconductor region in turn has FLRs provided external to its perimeter in such a way that they are buried in said semiconductor layer of a first conduction type. The buried FLRs increase the extent of the depletion layer by a sufficient degree to improve the breakdown voltage without causing unwanted discontinuities in the interface between the semiconductor layer and the overlying insulator film or redistribution of impurities from the FLRs into the insulator film. As a result, the interface energy level is sufficiently stabilized to improve the dielectric breakdown strength characteristics. Hence, the semiconductor apparatus of the invention has high breakdown voltage.

The process according to the second aspect of the invention provides a simple way to form buried FLRs in the semiconductor layer, thereby enabling the fabrication of a semiconductor apparatus in which neither of the FLRs are exposed from the surface of the semiconductor layer.

BRIEF DESCRIPTION OF DRAWINGS

The semiconductor apparatus of the invention and the process for its fabrication will now be described with reference to FIGS. 1–3.

BEST MODE FOR CARRYING OUT THE INVENTION

Figure 1:
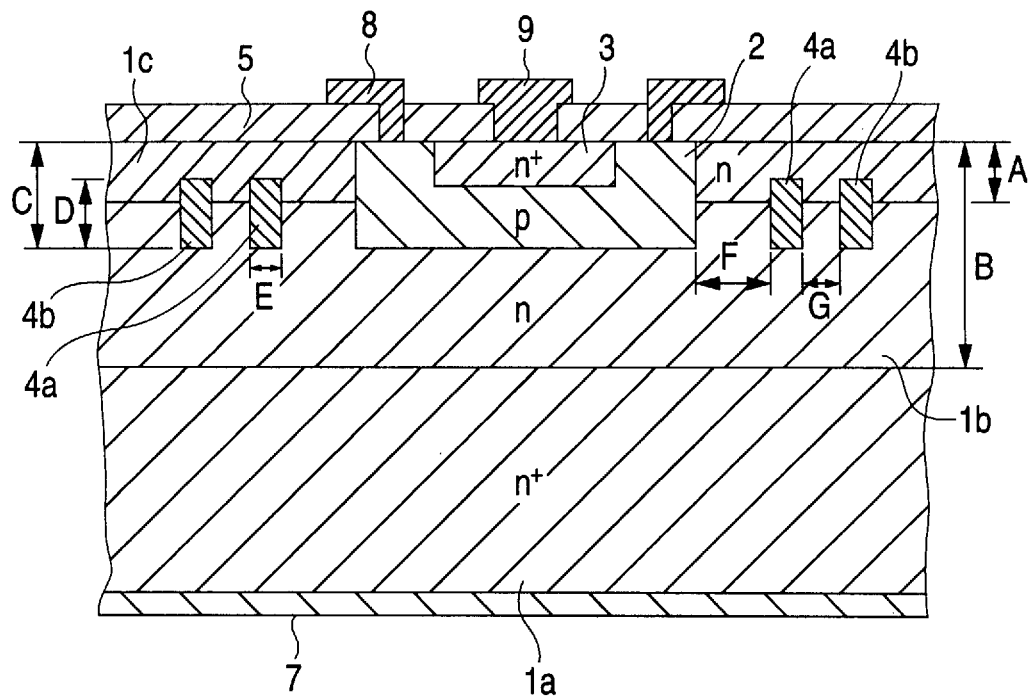
FIG. 1 is a sectional view showing an example of the semiconductor apparatus according to the first aspect of the invention.

As shown in FIG. 1, the transistor which is an example of the semiconductor apparatus of the invention comprises a typically $n^+$ type semiconductor substrate $1a$ which has formed on its surface an $n^-$ type semiconductor layer $1b$ of the same conduction type but of a lower impurity level and which in turn is overlaid with an epitaxial layer $1c$ of the same conduction type as the semiconductor layer $1b$, thereby forming the collector region 1 of the transistor which is a semiconductor layer of a first conduction type. A p-type impurity of a second conduction type is doped into the surface of the epitaxial layer $1c$ to form a base region 2 and an $n^+$ type impurity is doped into the base region 2 to form an emitter region 3. FLRs $4a$ and $4b$ are provided in the semiconductor layer $1b$ and epitaxial layer $1c$ in the field region which is laterally external to the perimeter of the base region 2. The present invention is characterized in that FLRs $4a$ and $4b$ are not exposed from the surface of the epitaxial layer $1c$ but are enclosed by the epitaxial layer $1c$ and the semiconductor layer $1b$.

The surface of the epitaxial layer $1c$ is overlaid with an insulator film 5 which is typically made of silicon oxide to serve as a mask for forming the base region 2 and the emitter region 3. Base electrodes 8 and an emitter electrode 9 which are typically made of aluminum are provided via respective contact holes made in the insulator film 5. A collector electrode 9 is provided on the back surface of the semiconductor substrate $1a$. A device-defining annular ring is omitted from FIG. 1 for the sake of clarity.

In the example under consideration, two FLRs $4a$ and $4b$ are provided. The greater the number of FLRs that are provided, the higher the dielectric breakdown strength but, on the other hand, the chip area increases with the increasing number of FLRs. Even a single FLR contributes to a marked improvement in the breakdown voltage and the number of FLRs should be determined in accordance with the specific object of interest.

The $n^+$ type semiconductor $1a$ and the $n^-$ type semiconductor layer $1b$ can be formed by any method; for instance, the semiconductor layer $1b$ may be formed by epitaxial growth on the semiconductor substrate $1a$ or, alternatively, an n-type impurity may be doped into the back surface of an initially $n^-$ type semiconductor substrate to form an $n^+$ type layer which serves as the semiconductor substrate $1a$. The $n^+$ type semiconductor substrate $1a$ is typically adapted to have an impurity level of about $1\times10^{18}$–$1\times10^{20}/cm^3$ whereas the $n^-$ type semiconductor layer $1b$ and the $n^-$ type epitaxial layer $1c$ are both adapted to have an impurity level of about $1\times10^{13}$–$1\times10^{15}/cm^3$. The thickness A of the epitaxial layer $1c$ is adapted to about 5–20 μm and the total thickness B of the epitaxial layer $1c$ combined with the semiconductor layer $1b$ is adapted to about 40–120 μm. The depth C of the base region 2 as measured from the surface of the epitaxial layer $1c$ is typically adapted to about 10–30 μm. The impurity level of the base region 2 is adapted to about $5\times10^{16}$–$1\times10^{17}/cm^3$ whereas the impurity level of the emitter region 3 is adapted to about $1\times10^{18}$–$1\times10^{20}/cm^3$. FLRs $4a$ and $4b$ are formed to have the same conduction type and impurity level as the base region 2. The height D of each FLR is adapted to about 5–20 μm, its width E to about 15–20 μm, the distance F between FLR $4a$ and the perimeter of the base region 2 to about 45–55 μm, and the spacing G between $4a$ and $4b$ to about 50–60 μm.

Thus, the semiconductor apparatus according to the first aspect of the invention has such a structure that the semiconductor layers of a first conduction type (i.e., the $n^-$ type semiconductor layer $1b$ and epitaxial layer $1c$) are provided with the semiconductor region of a second conduction type (i.e., the p-type base region 2) to form a semiconductor device (transistor) and that FLRs $4a$ and $4b$ are provided external to the perimeter of said semiconductor region but without being exposed from the surface of the epitaxial layer $1c$. With this structure, the surface of the semiconductor layer 1b in the area external to the perimeter of the base region 2 and which is the interface with the insulator film 5 is uniformly covered with only the epitaxial layer 1c and provides no discontinuities despite the presence of FLRs 4a and 4b. In addition, there is no possibility for the impurities to be redistributed from FLRs 4a and 4b into the insulator film 5 which, hence, will not be contaminated in such a manner as to reduce the dielectric breakdown strength.

Figure 2:
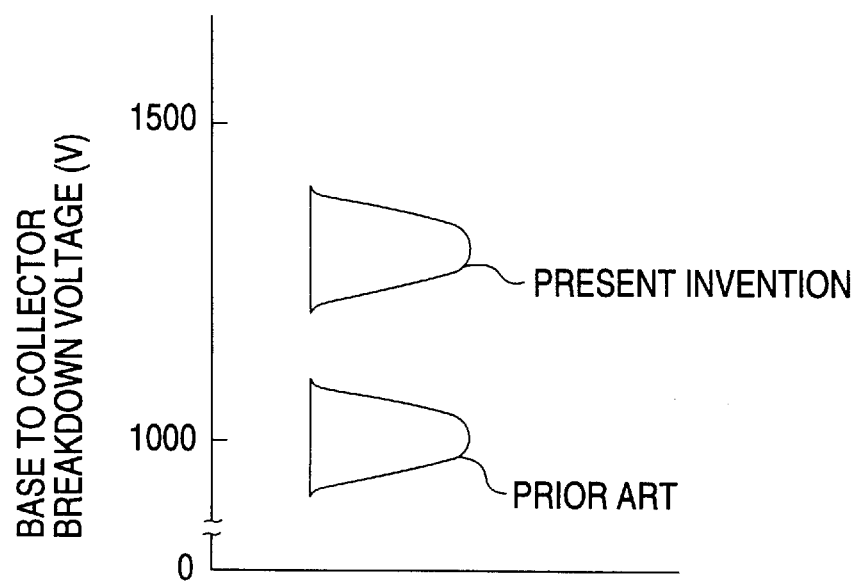
FIG. 2 is a diagram showing the profile of the base-to-collector breakdown voltage of the semiconductor apparatus.

The profile of the base-to-collector breakdown voltage of the transistor according to the illustrated example of the invention is shown in FIG. 2 as compared with the data for the prior art transistor which has a FLR exposed from the surface of the semiconductor layer. Both data were taken on 20 samples each. Obviously, the base-to-collector breakdown voltage of the prior art transistor was about 1,000 volts but the transistor of the invention could withstand about 1,300 volts.

Figure 3:
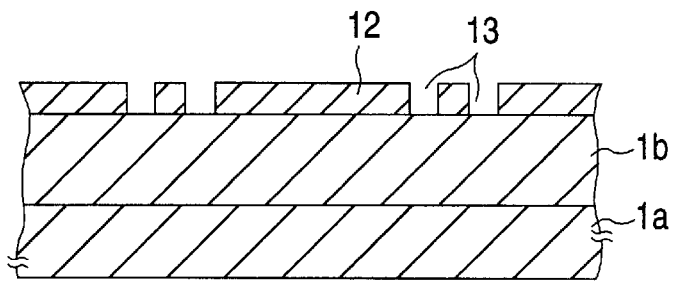
FIGS. 3(a)–3(d) show a fabrication sequence for the same semiconductor apparatus.
Figure 3:
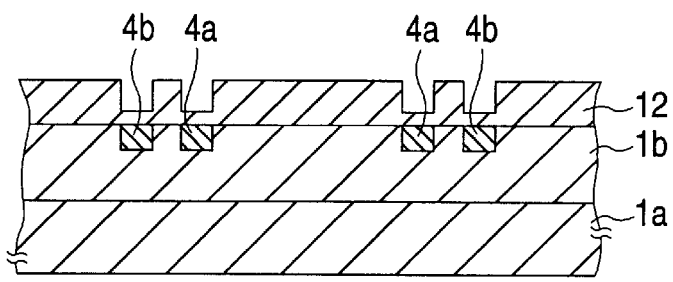
Figure 3:
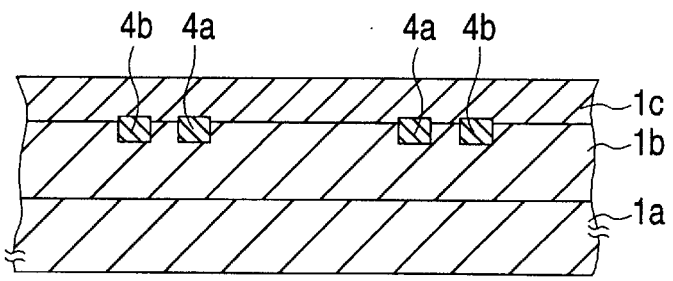
Figure 3:
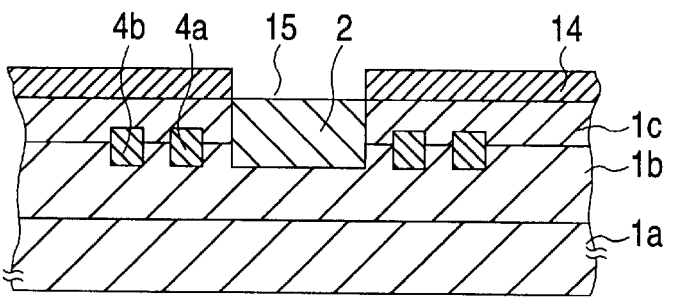
Figure 4:
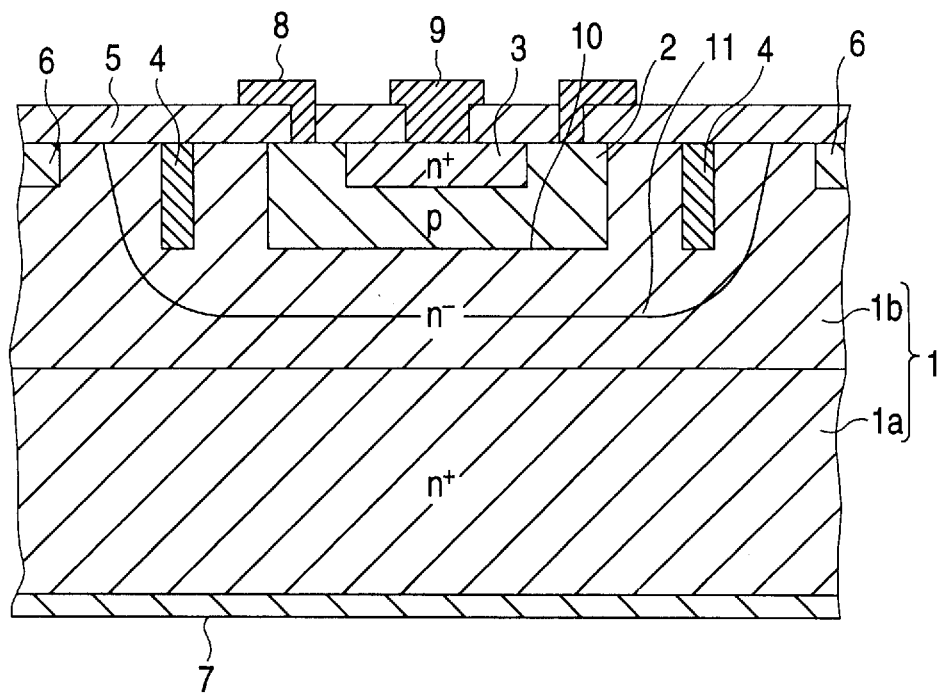
FIG. 4 is a sectional view showing a prior art transistor.
Figure 5:
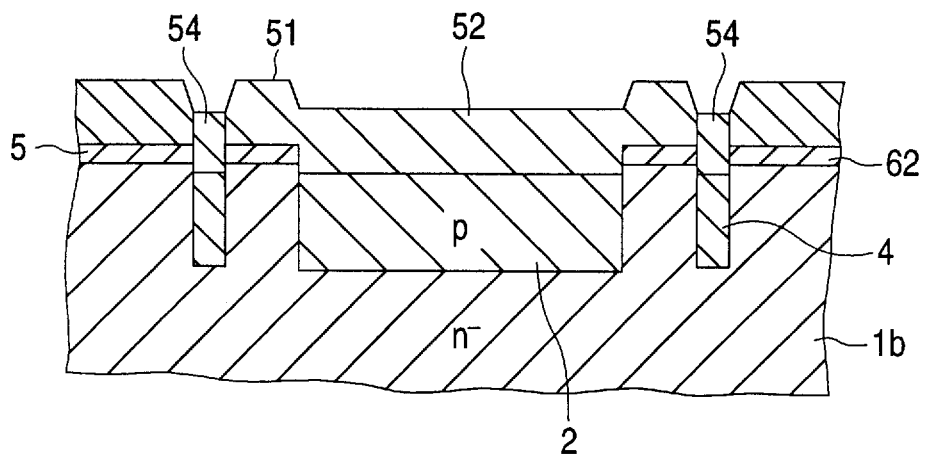
FIG. 5 is a partial section showing the FLR and nearby area of the prior art transistor.

The process for the fabrication of the transistor according to the illustrated example of the invention will now be described with reference to FIG. 3.

First, one surface of n⁻ type semiconductor layer 1b having n⁺ type semiconductor substrate 1a on the other surface is overlaid with SiO₂ film 12 in a thickness of about 0.5–1 μm by thermal oxidation at 900°–1,200° C., and a first group of windows 13 are made in the SiO₂ film at the sites where FLRs 4a and 4b are to be formed (see FIG. 3a). The windows 13 are provided by a conventional photolithographic procedure consisting of resist application, exposure and etching.

In the next step, an impurity such as phosphorus or arsenic is doped into the semiconductor layer 1b through windows 13 in the SiO₂ film 12 to form buried FLRs 4a and 4b (see FIG. 3b).

Then, SiO₂ film 12 is removed and n⁻ type epitaxial layer 1c is grown on the surface of semiconductor layer 1b (see FIG. 3c).

Subsequently, insulator film 14 typically made of SiO₂ is formed on the surface of epitaxial layer 1c by a suitable technique such as thermal oxidation and a second window 15 is formed in the insulator film 14 by the same photolithographic patterning procedure as employed to make the windows 13. Then, a p-type impurity to form base region 2 is doped into the epitaxial layer 1c by diffusion. Concurrently with this doping step, the impurities in buried FLRs 4a and 4b are diffused into the epitaxially grown layer 1c such that part of the FLRs will rise to enter the epitaxial layer 1c. However, the rise of the FLRs is so small that neither of them will be exposed from the surface of the epitaxial layer 1c.

Although not shown, the subsequent process consists of providing a second insulator film on the surface, patterning by the same procedure as above, impurity diffusion to form an emitter, and the provision of the necessary electrodes such as a base and an emitter electrode, thereby completing the fabrication of the desired transistor.

According to the process described above, FLRs 4a and 4b are provided in the surface of semiconductor layer 1b before epitaxial layer 1c is grown on the latter. Hence, one can fabricate a semiconductor apparatus in which the two FLRs are completely enclosed by semiconductor layer 1b and epitaxial layer 1c and will not be exposed from the surface of epitaxial layer 1c. In addition, FLRs 4a and 4b are formed in a separate step from the base region 2 and, hence, their impurity levels can be controlled to any desired values in such a way as to permit free adjustments of the spread of the depletion layer.

Industrial Applicability

In accordance with the invention, the semiconductor apparatus according to the first aspect of the invention comprises a semiconductor layer of a first conduction type that is provided with a semiconductor region of a second conduction type to form a semiconductor device and said semiconductor region in turn has FLRs provided external to its perimeter in such a way that they are buried in said semiconductor layer of a first conduction type. The buried FLRs increase the extent of the depletion layer by a sufficient degree to improve the breakdown voltage without causing unwanted discontinuities in the interface between the semiconductor layer and the overlying insulator film or redistribution of impurities from the FLRs into the insulator film. As a result, the interface energy level is sufficiently stabilized to improve the dielectric breakdown strength characteristics. Hence, the semiconductor apparatus of the invention has high breakdown voltage.

The process according to the second aspect of the invention provides a simple way to form buried FLRs in the semiconductor layer, thereby enabling the fabrication of a semiconductor apparatus in which neither of the FLRs are exposed from the surface of the semiconductor layer.

I claim:

1. A semiconductor apparatus comprising:
   a semiconductor layer of a first conduction type;
   a semiconductor region of a second conduction type provided in said semiconductor layer to form a semiconductor device;
   a field-limiting ring of a second conduction type provided external to a perimeter of said semiconductor region to improve the breakdown voltage;
   an epitaxial layer of the first conduction type on a surface of the semiconductor layer of the first conduction type and covering the entire surface of the semiconductor layer of the first conduction type but not covering the semiconductor region of the second conduction type; and
   an insulating layer covering a surface of the epitaxial layer and the semiconductor region of the second conduction type;
   whereby any field-limiting ring is spaced from said insulating layer by a layer of the first conduction type.

2. A semiconductor apparatus according to claim 1, wherein said semiconductor region of a second conduction type forms a base region of a transistor and wherein said field-limiting ring is provided outside the perimeter of said base region.

3. A process for fabricating a semiconductor apparatus comprising a semiconductor layer of a first conduction type, a semiconductor region of a second conduction type provided in said semiconductor layer to form a semiconductor device, and a field-limiting ring of a second conduction type provided external to a perimeter of said semiconductor region to improve the breakdown voltage, the process comprising the steps of:
   forming said field-limiting ring in said semiconductor layer of a first conduction type;
   forming an epitaxial layer of a first conduction type on a surface of said semiconductor layer of a first conduction type so as to cover the entire surface of the semiconductor layer of the first conduction type;
   forming said semiconductor region of a second conduction type in a surface of said epitaxial layer; and
   forming an oxide insulating layer on a surface of the epitaxial layer and the semiconductor region of the second conduction type;
   whereby any field limiting ring is spaced from the oxide insulating layer by a layer of the first conduction type.

* * * * *